(12) United States Patent
Chen et al.

(10) Patent No.: US 9,048,069 B2
(45) Date of Patent: Jun. 2, 2015

(54) DOSAGE ACCURACY MONITORING SYSTEMS OF IMPLANTERS

(75) Inventors: Juan-Lin Chen, Shanhua (TW); Yung-Fu Yeh, Sikou (TW); Yuk-Tong Lee, Fongshan (TW); Nai-Han Cheng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2436 days.

(21) Appl. No.: 11/809,644

(22) Filed: Jun. 1, 2007

(65) Prior Publication Data

US 2008/0296472 A1 Dec. 4, 2008

(51) Int. Cl.
*H01J 37/244* (2006.01)
*H01J 37/317* (2006.01)
*H01J 37/24* (2006.01)
*H01J 37/304* (2006.01)

(52) U.S. Cl.
CPC .......... *H01J 37/3171* (2013.01); *H01J 37/243* (2013.01); *H01J 37/304* (2013.01); *H01J 2237/30472* (2013.01); *H01J 2237/31703* (2013.01)

(58) Field of Classification Search
None
See application file for complete search history.

(56) References Cited

U.S. PATENT DOCUMENTS

| | | | | | |
|---|---|---|---|---|---|
| 4,234,797 | A | * | 11/1980 | Ryding | 250/492.3 |
| 4,494,005 | A | * | 1/1985 | Shibata et al. | 250/492.2 |
| 4,743,767 | A | * | 5/1988 | Plumb et al. | 250/492.2 |
| 5,126,576 | A | * | 6/1992 | Wauk et al. | 250/492.2 |
| 6,965,116 | B1 | * | 11/2005 | Wagner et al. | 250/492.21 |
| 7,323,700 | B1 | * | 1/2008 | Ledoux et al. | 250/492.21 |
| 7,547,460 | B2 | * | 6/2009 | Cucchetti et al. | 427/8 |
| 2008/0087808 | A1 | * | 4/2008 | Ledoux et al. | 250/252.1 |

\* cited by examiner

*Primary Examiner* — Andrew Smyth
(74) *Attorney, Agent, or Firm* — Slater & Matsil, L.L.P.

(57) ABSTRACT

An apparatus for monitoring beam currents of an implanter is provided. The apparatus includes a beam-sensing unit for sensing the beam currents; a position-determining unit for determining scan positions; and a computing unit. The computing unit is configured to perform the functions of receiving the beam currents from the beam-sensing unit; receiving the scan positions from the position-determining unit; and determining a drift status of the implanter from the beam currents, wherein the computing unit is configured to receive the beam currents and the scan position periodically between a starting time and an ending time of a scan process of the implanter.

28 Claims, 9 Drawing Sheets ated circuits. Second, different regions on wafers 14 may receive different dosages, and the uniformity of wafers 14 is adversely affected.

Between the starting time and the end time of a scan process, wafers 14 block the beam current, and the amount of ion beam 18 blocked by wafers 14 changes with the position of spin wheel 10. It is thus difficult to determine whether beam currents between the starting time and the end time of a scan process are stable or not. Accordingly, a new method for more accurately monitoring the beam currents is needed.

DOSAGE ACCURACY MONITORING SYSTEMS OF IMPLANTERS

TECHNICAL FIELD

This invention relates generally to semiconductor manufacturing equipments, and more particularly to implanters for implanting ions into integrated circuit components, and even more particularly to the accuracy control of implanters.

BACKGROUND

Implantation is one of the most common techniques in the manufacturing of modern integrated circuits. In an implantation process, ions are implanted into wafers. The wafers are patterned with only desired regions exposed to the implantation, while the remaining portions of the wafers are masked. Typically, the implantations are performed by implanters, in which ions are accelerated and directed as an ion beam.

FIG. 1 schematically illustrates a portion of implanter 2 including spin wheel 10 and arms 12 attached thereon. A plurality of wafers 14 is mounted to the ends of arms 12. During an implantation process, spin wheel 10 spins at a high speed, which may be as high as 1250 rotations per minute. Accordingly, wafers 14 spin around the center of spin wheel 10. The implanter 2 further includes an opening 16, through which ion beam 18 is projected, wherein the beam current of ion beam 18 is substantially stable.

Spin wheel 10 can move back and forth in the direction of arrow 20. In the beginning of an implantation process, wafers 14, which spin at a high speed, are to the left side of beam 18. When spin wheel 10 moves right, the wafers 14 are impacted by ion beam 18. The speed that spin wheel 10 moves left and right is significantly slower than the spin speed of wafers 14. Therefore, when wafers 14 rotate by one circle, a slot on each of wafers 14 is scanned by ion beam 18. Each of the subsequent rotations of spin wheel 10 causes a new slot on each of the wafers 14 to be scanned. Typically, spin wheel 10 keeps moving right until it reaches a point that wafers 14 are on the right side of ion beam 18. At this time, the entirety of wafers 14 has been scanned slot by slot. Spin wheel 10 then starts moving left until it is back to the starting position, during which wafers 14 are scanned again. The entire process that spin wheel 10 moves once forth and once back is referred as a scan process. An implantation process may include multiple scan processes.

As is known in the art, the performance of integrated circuits depends largely upon the accuracy of the doping concentration in the implanted regions. Therefore, the dosage, or the beam current of ion beam 18 needs to be accurately controlled. To monitor the beam current, sensor 26 is placed on the projected path of ion beam 18 and at a location behind wafers 14. At a starting time and an ending time of a scan process, wafers 14 do not block ion beam 18 from sensor 26, and thus sensor 26 receives a full capacity of ion beam 18. The beam currents at the starting times and the ending times of the scan processes are thus measured to determine the stability of ion beam 18. Accordingly, dosage received by wafers 14 is monitored.

The dosage monitoring method discussed in the preceding paragraphs, however, suffers drawbacks. Since for each scan process, only the beam currents at the starting time and the end time are measured, if the beam currents drift at any time between the starting time and the end time, the drift cannot be detected. The beam current drift causes two problems. First, the total dosage received by wafers 14 will be different from the desirable value, causing performance shifts of the result-

SUMMARY OF THE INVENTION

In accordance with one aspect of the present invention, an apparatus for monitoring beam currents of an implanter is provided. The apparatus includes a beam-sensing unit for sensing the beam currents; a position-determining unit for determining scan positions; and a computing unit. The computing unit is configured to perform the functions of receiving the beam currents from the beam-sensing unit; receiving the scan positions from the position-determining unit; and determining a drift status of the implanter from the beam currents, wherein the computing unit is configured to receive the beam currents and the scan position periodically between a starting time and an ending time of a scan process of the implanter.

In accordance with another aspect of the present invention, an implanter for implanting wafers includes a movable spin wheel configured to have wafers mounted thereon; a beam-sensing unit and a computing unit. The beam-sensing unit is configured to perform the functions for sensing a first beam current at a starting time of a scan process; and sensing a second beam current at an intermediate time between the starting time and an ending time of the scan process. The computing unit is configured to perform the functions for receiving the first and the second beam currents from the beam-sensing unit; calculating a channel factor using the first and the second beam currents; and determining a drift status of the implanter by comparing the channel factor and a predetermined channel factor range.

In accordance with yet another aspect of the present invention, a method of monitoring a scan process of an implanter includes pre-determining a first allowable beam current range; measuring a first beam current at a starting time of the scan process; measuring a second beam current at an intermediate time between the starting time and an ending time of the scan process; and determining a drift status of the implanter by comparing the second beam current to the first beam current and the first allowable beam current range.

In accordance with yet another aspect of the present invention, a method of monitoring an implanter includes pre-determining an allowable channel factor range, wherein the allowable channel factor range comprises a maximum channel factor and a minimum channel factor; starting a scan process; measuring a first beam current at a starting time of the scan process; periodically measuring a plurality of second beam currents in a duration between the starting time and an ending time of the scan process; calculating a plurality of channel factors, each by using the first beam current and one of the plurality of second beam currents; and determining a drift status of the implanter by comparing the plurality of channel factors with the allowable channel factor range.

The embodiments of the present invention advantageously provide the capability of real-time monitoring of the drift of beam currents of the implanters.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
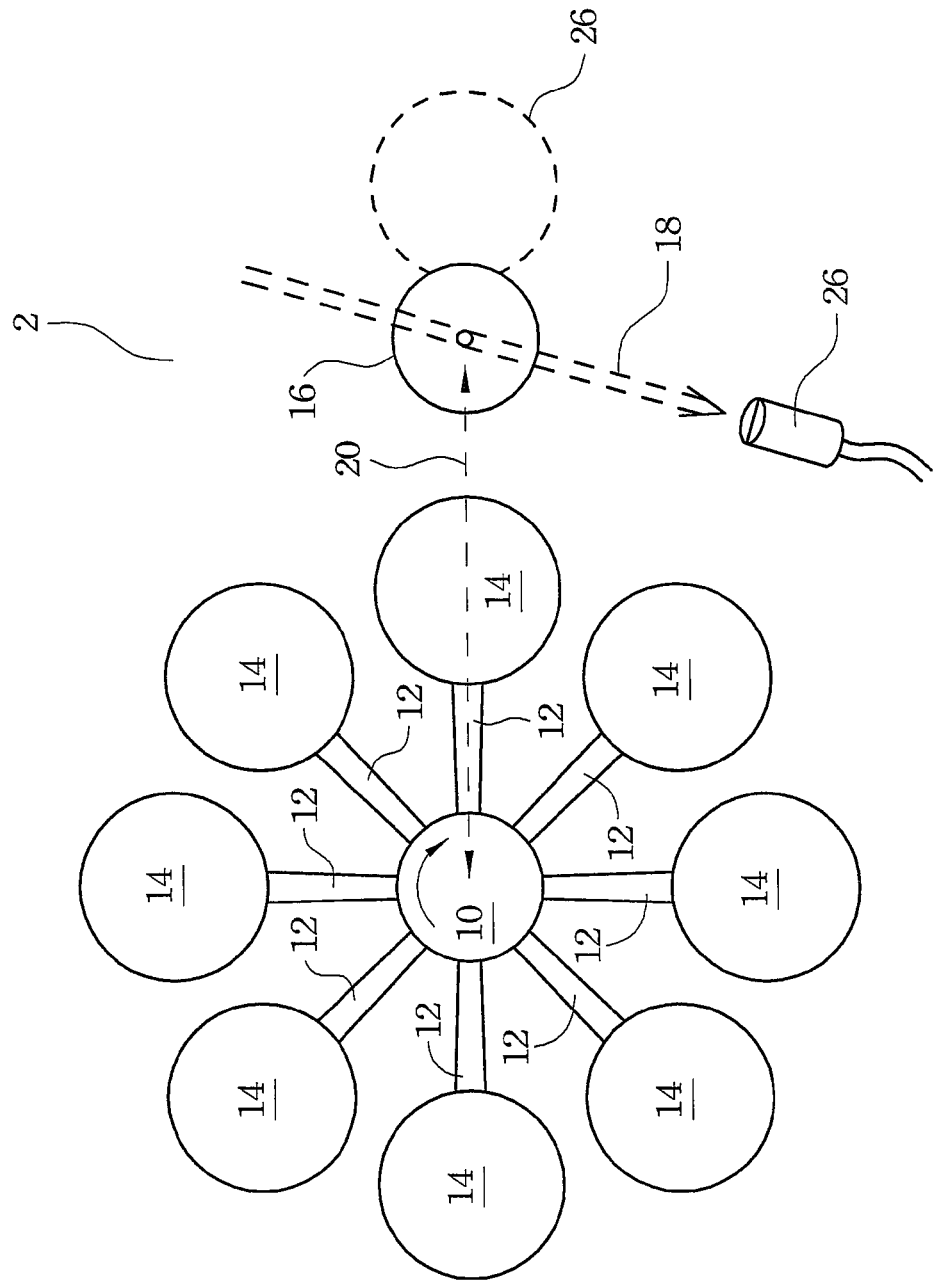
FIG. 1 illustrates a conventional implanter having a sensor for sensing beam currents at the starting time and ending time of a scan process.
Figure 2:
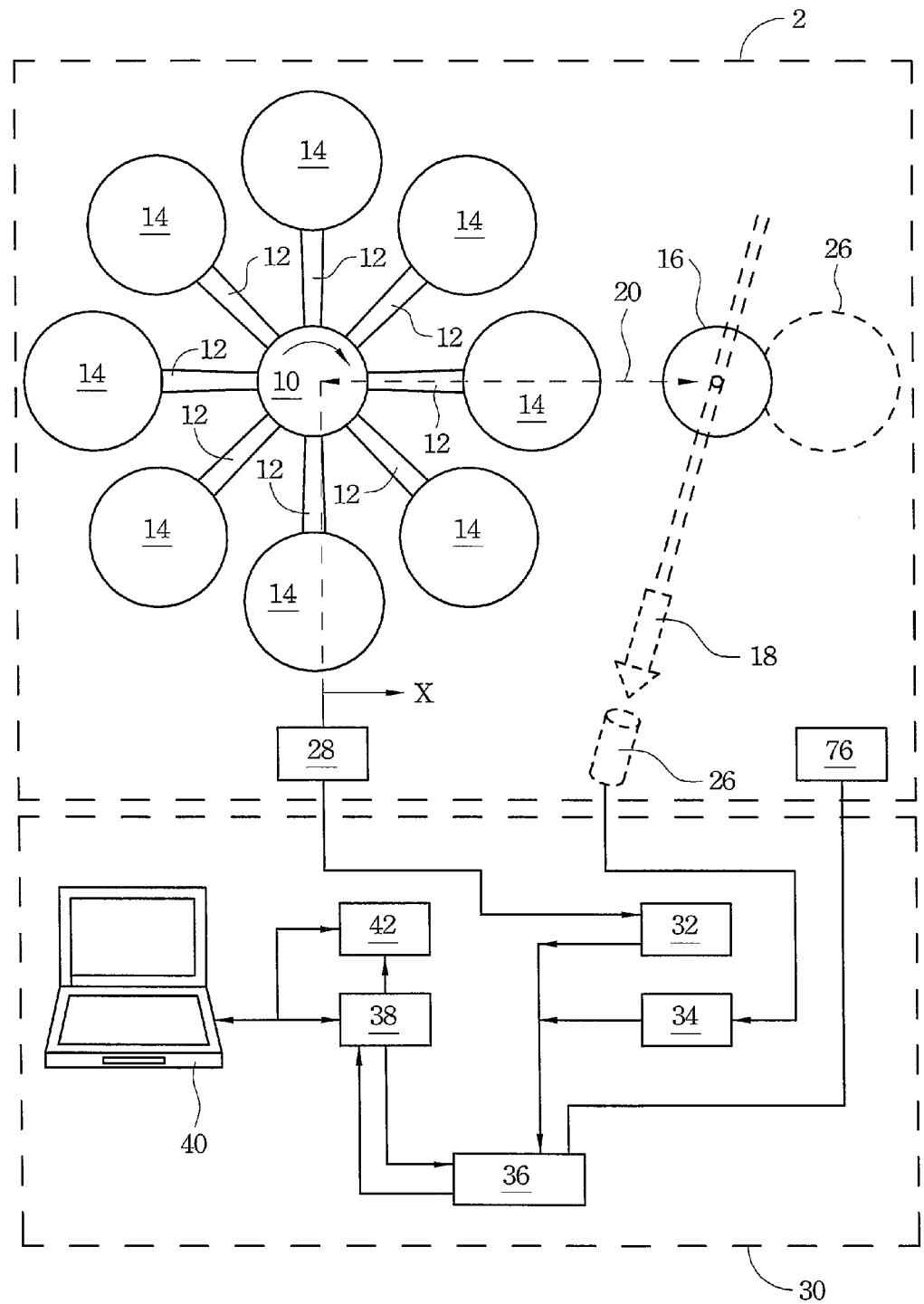
FIG. 2 illustrates an apparatus for real-time monitoring beam currents of an implanter.

FIG. 2 illustrates an embodiment of the present invention, which includes implanter 2 connected to real-time monitoring system 30. Although illustrated as independent from implanter 2, real-time monitoring system 30 may be built inside implanter 2. Implanter 2 includes spin wheel 10, and arms 12 attached to spin wheel 10. Wafers 14 are mounted at the ends of arms 12. Spin wheel 10 may move back and forth along arrow 20, so that wafers 14 receive beam 18, which is projected through opening 16. One skilled in the art will realize that implanters may have different structures as shown in FIG. 2. However, the concept provided by the teaching of the embodiments of the present invention is also applicable.

The position x of spin wheel 10 (referred to as scan position hereinafter) is recorded by implanter 2 and outputted as a position voltage, which may be obtained from scan controller 28, which is a built-in unit in implanter 2. Assuming the illustrated scan position is a starting position, when a scan process begins, spin wheel 10 moves right, and scan position x increases. As a result, the position voltage outputted by scan controller 28 changes accordingly. The position voltage is collected by position decoder 32, which converts the analog position signal to a digital position signal. The digital position signal is transferred to converter 36, which converts the digital position signal to a format recognizable to computing unit 40. Buffer server 38 then buffers the digital position signal. Computing unit (also referred to as an equivalent query system, or EQS) 40 then processes the digital position signal, as will be discussed in subsequent paragraphs.

Beam sensor 26 is placed in the projected path of beam 18 and senses beam currents periodically. The sensed beam current is forward to beam current decoder 34, which converts the analog beam current signal to a digital beam current signal. The digital beam current signal is transferred to converter 36, and is converted to a format recognizable to computing unit 40. Buffer server 38 buffers and passes the digital beam current signal to computing unit 40 for further processing.

During a scan process, the scan positions x and the beam currents are periodically measured in real-time, and eventually fed to computing unit 40. In an exemplary embodiment, the interval between the measurements is about 0.2 seconds, although different intervals may be adopted, depending on the specifications of the implantation processes, such as the duration of each scan, the volatility of the beam current, the allowable dosage drift, and the like.

Figure 3:
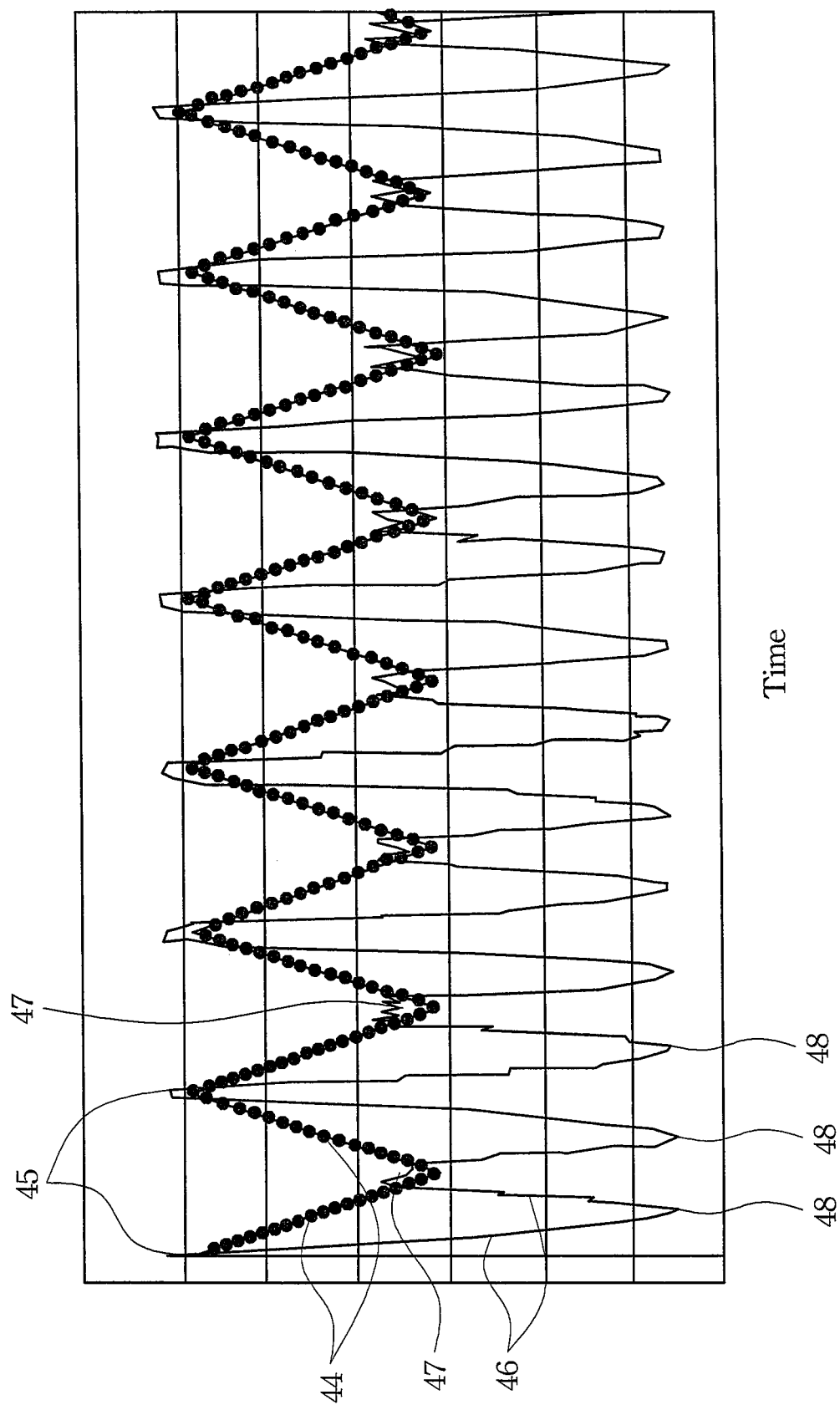
FIG. 3 illustrates scan positions and beam currents as functions of time.
Figure 4A:
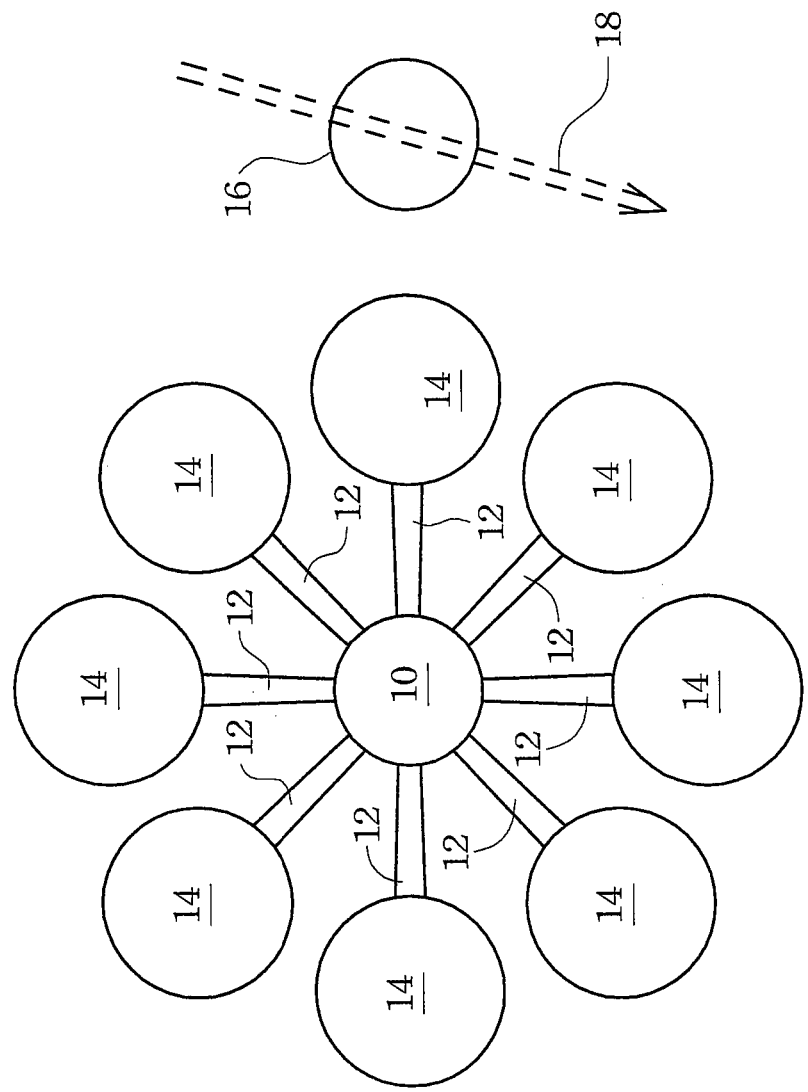
FIGS. 4A through 4C illustrate three wafer positions.
Figure 4B:
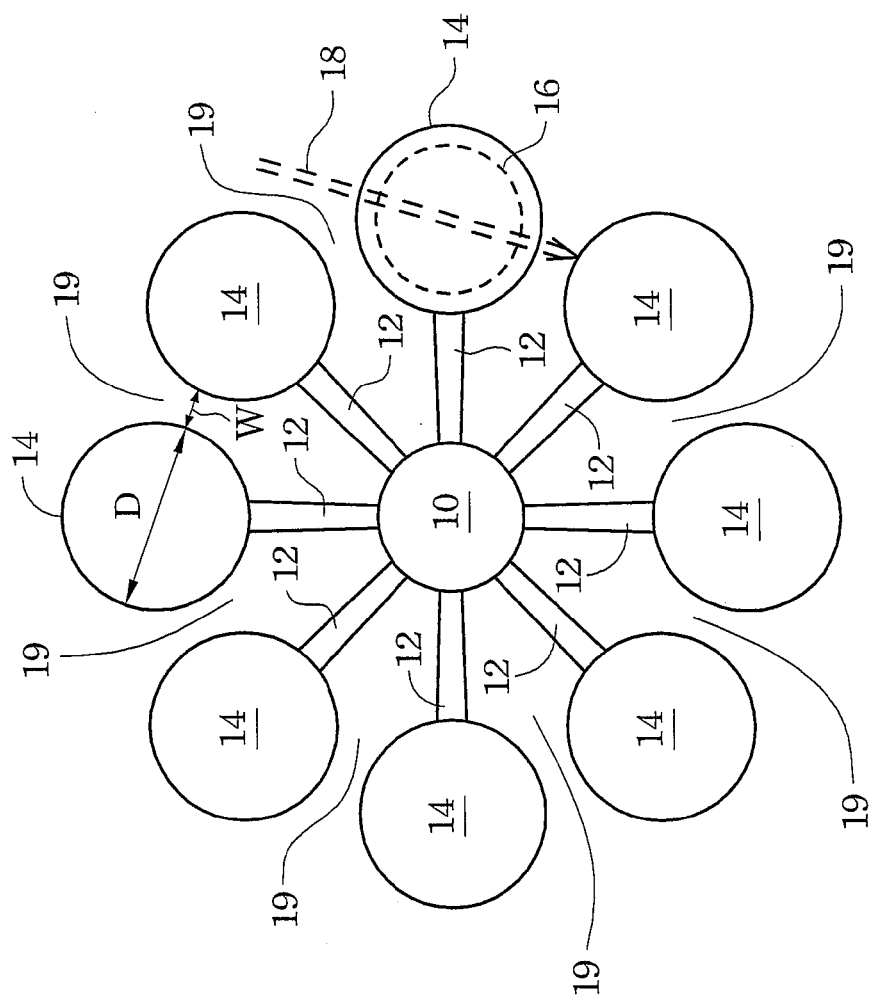

FIG. 3 illustrates exemplary scan position x and the beam current as functions of time, wherein the repeated patterns illustrates a plurality of scan processes. Line 44 illustrates the scan position x. FIG. 3 is a captured experiment result, and the scan positions x at the highest points of line 44 are the starting positions (leftmost positions), while the lowest points of line 44 are the rightmost positions, of the scan processes. Line 46 indicates the sensed beam current, which is measured by beam sensor 26. It is noted that at the starting points of the scan processes, the beam currents are also the highest due to the fact that wafers 14 do not block beam 18. FIG. 4A schematically illustrates the relative positions of beam 18 and wafers 14 at the starting time of the scan processes. When spin wheel 10 moves right (the values of points on line 44 decrease), wafers 14 start to block portions of beam current 18, and the sensed beam current (line 46) decreases. When the centers of wafers 14 reach the center of beam 18, which is illustrated in FIG. 4B, it is expected that the sensed beam current is the lowest (points 48). However, even at these points, due to the gap between wafers 14, portions of beam 18 are still able to reach beam sensor 26 through the gaps 19, which are between wafers 14 (refer to FIG. 4B), and the sensed beam currents still have non-zero values.

Figure 4C:
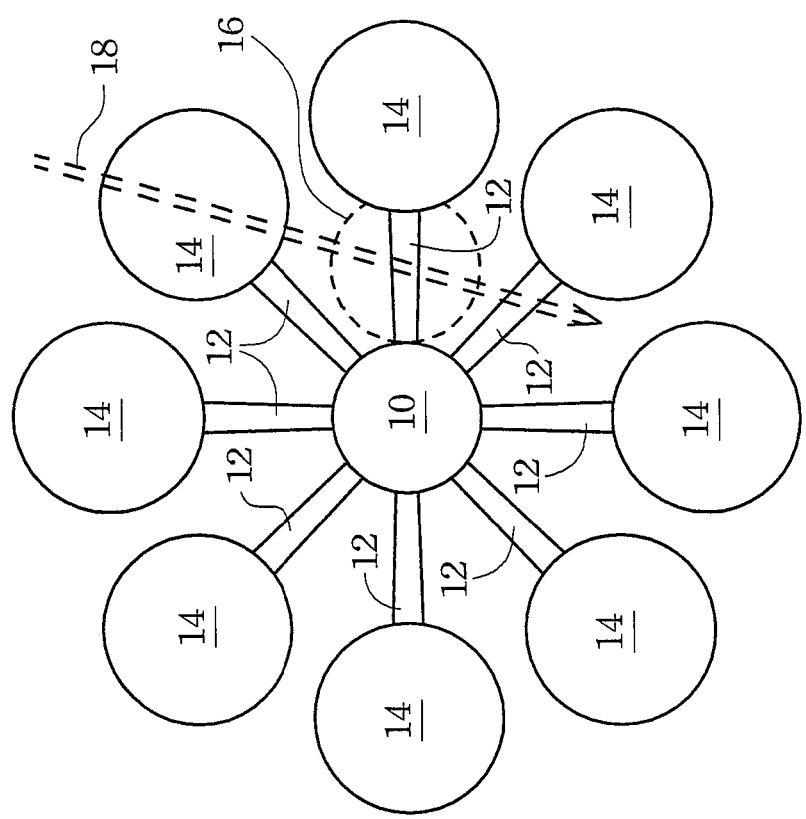

When the centers of wafers 14 continue to move to the right of beam 18, the sensed beam current increases again. At the rightmost scan position x, at which the spinning wafers 14 are on the right side of beam 18 (refer to FIG. 4C for the relative relationship of beam 18 and wafers 14), the magnitude of the sensed beam current (points 47 in FIG. 3) is still less than the highest values at points 45 in FIG. 3. One of the reasons is that arms 12 block portions of beam 18. After one scan process, which is between two peak points 45, another scan is started, producing a substantially same pattern as the previous scan process.

Figure 5:
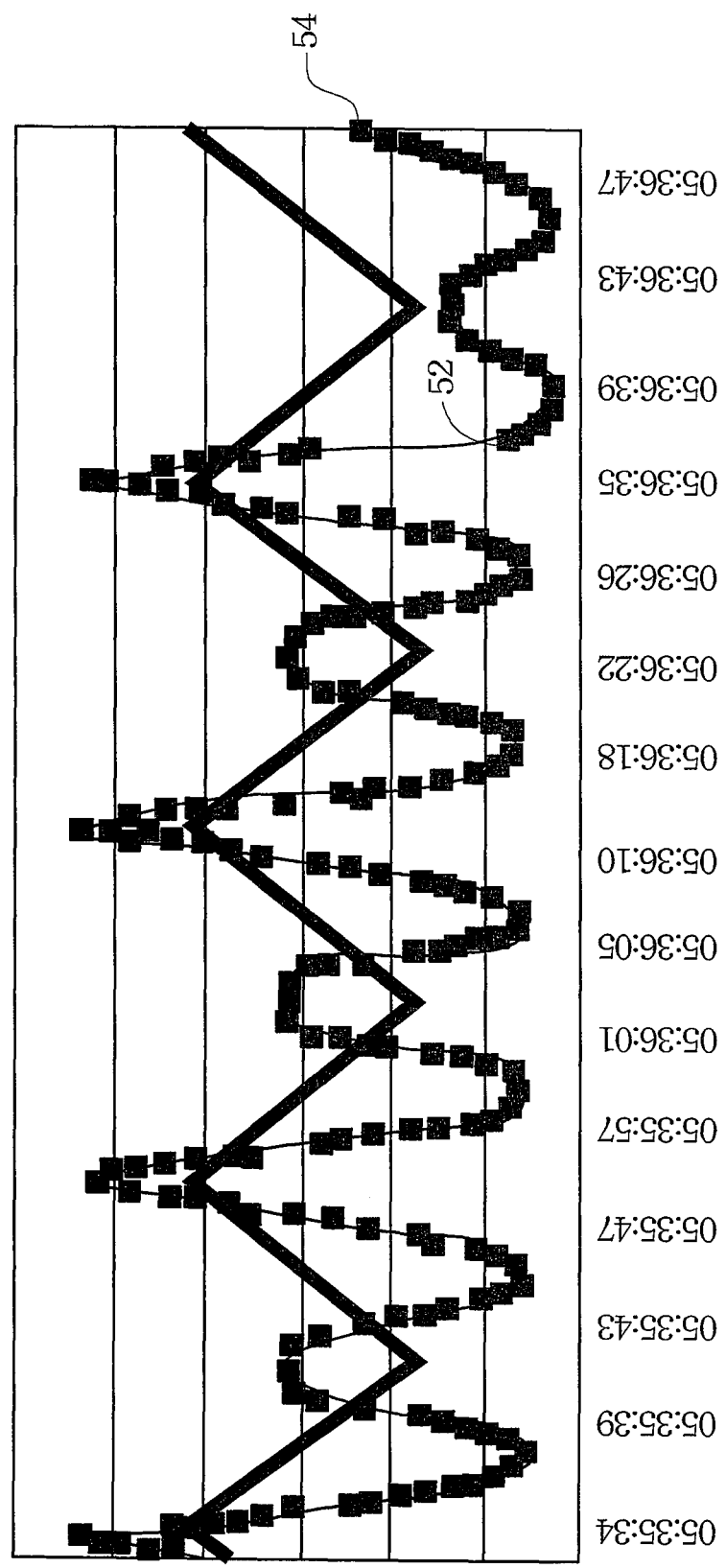
FIG. 5 illustrates a dosage drift found in an experiment.

During an implantation process, which may include a plurality of scan processes, the beam current of beam 18 may drift, and hence the sensed beam current drifts from the projected values accordingly. The projected values may be found from statistic values collected from experiments, and/or from previous scan processes. FIG. 5 illustrates a beam current drift caught in an experiment. At point 52, the sensed beam currents drift lower than the projected values, which are shown in the repeated patterns before point 52.

The drift of beam current may be represented and processed by various methods. In the preferred embodiment, channel factor F is defined to reflect the drift of sensed beam current from the projected values:

$$F = Bi/Br \quad \text{[Eq. 1]}$$

Wherein Bi is the initial sensed beam current, which is sensed at the starting time (which corresponds to the starting scan position x) of the respective scan process. The initial sensed beam current Br is also expected to be the peak beam current. Br is the beam current sensed in real time. Br can be further expressed as $$Br = Bi^*(1-A(x)) \quad \text{[Eq. 2]}$$

In Equation 2, A(x) is the beam shadow factor reflecting how much percent of the beam current is shadowed by wafers 14 and arms 12 (refer to FIG. 2). It is expected that A(x) is a function of scan position x, and scan position x and beam shadow factor A(x) has a one-to-one correspondence in a give implanter and a given size of wafers 14. From Equations 1 and 2, channel factor F can be expressed as:

$$F=1/(1-A(x)) \quad [\text{Eq. 3}]$$

Regardless how channel factor F is defined, the channel factor reflects the relative value of the real-time sensed beam current Br. The behavior of the above-defined channel factor F is explained using an example as follows. At the starting time of the scan processes, beam 18 is not blocked, and thus beam shadow factor A(x) is 0. Accordingly, channel factor F is equal to 1. At the time when the centers of wafers 14 are aligned to beam 18, as is shown in FIG. 4B, most portions of beam 18 are blocked by wafers 14. Assuming gaps 19 between wafers 14 have a width W equal to about ⅑ of the diameter D of wafers 14 (refer to FIG. 4B), and further assuming the beam shadow factor A(x) is only determined by the blocking percentage (even though other factors may be involved), beam shadow factor A(x) will be about 0.9. Accordingly, channel factor F is expected to have a maximum value of about 10.

In an embodiment, the initial beam current Bi is first measured, and then real-time beam currents Br are sensed periodically, for example, at every 0.2 seconds. An adequate number of sensings are needed to improve the accuracy. In an exemplary embodiment, in each scan process, there are more than about 70 real-time beam currents measurements. Channel factors F for sensed real-time beam currents Br are calculated by computing unit 40. If the scan process is performed with no beam current drift, the calculated channel factors F will be in the range between about a lower control limit and an upper control limit, which are 1 and 10 in the previously discussed example, respectively. The calculated channel factors F will also be save in real-time monitor 42 for comparison purposes. If, however, the calculated channel factors F deviate from the expected range, further actions need to be taken.

Referring back to FIG. 2, when a drift of the implantation dosage is found, and the computing unit 40 has decided that implanter 2 needs to be paused, computing unit 40 sends a digital signal to buffer server 38, which routes the digital signal to converter 36. Converter 36 converts the digital signal to an analog signal, and transfers the analog signal to control center 76 of the implanter to pause implanter 2. In addition, the computing unit 40 may automatically alert operators by making phone calls or sending emails.

Figure 6:
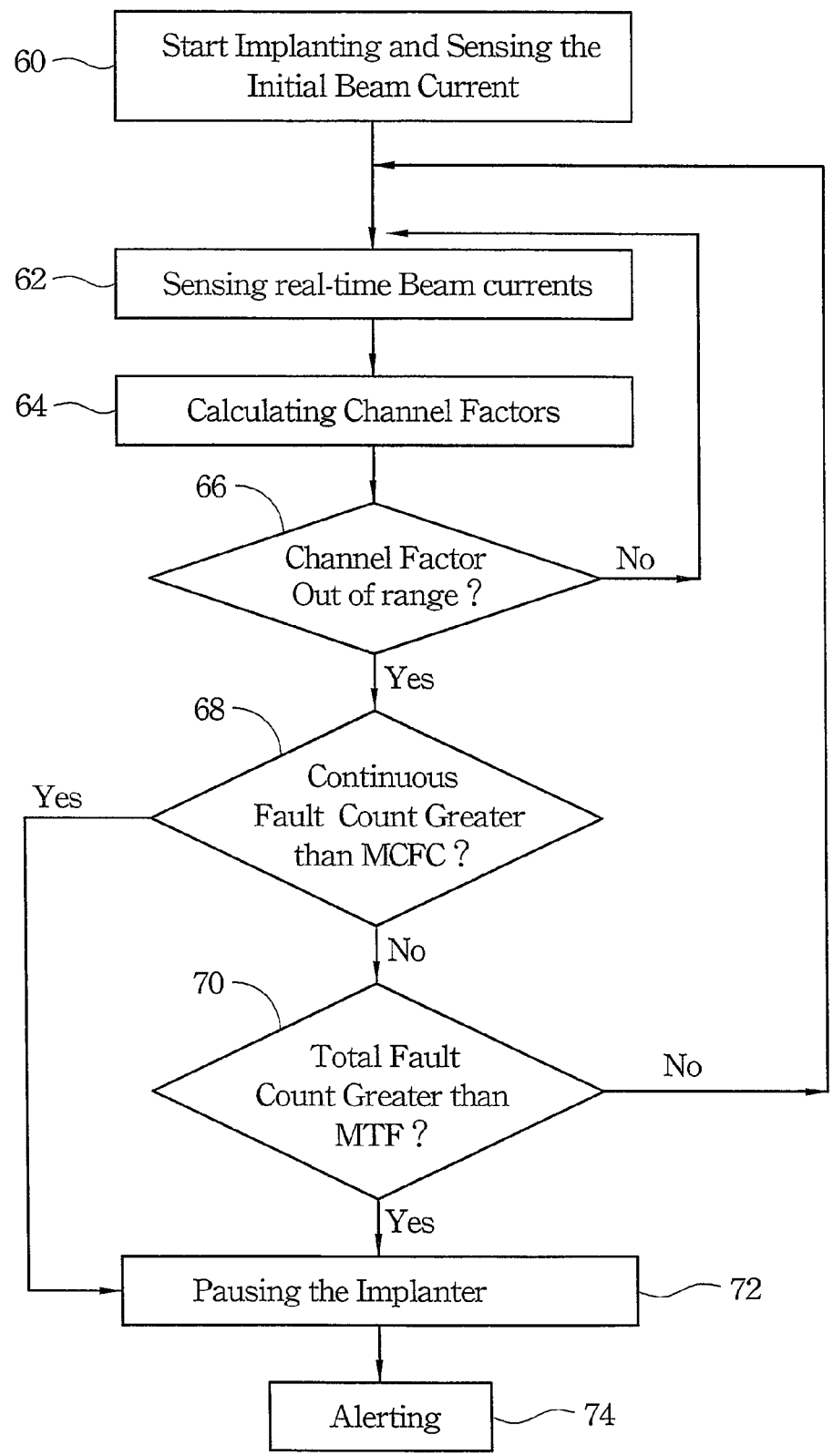
FIG. 6 illustrates a flowchart for determining a drift status of an implanter.

FIG. 6 illustrates an exemplary flowchart for monitoring beam currents. First, the implantation process is performed and the initial beam current Bi is sensed (step 60). Beam currents Br are then sensed (step 62), from which channel factors F are then calculated (step 64). Assuming an upper control limit of the channel factor F is set to 14 and a lower control limit of the channel factor F is set to 0.99, any channel factor greater than 14 or lower than 0.99 is recorded as a fault, although ideally, the channel factor should be between 1 and 10. If no fault is found, the scan process proceeds (step 66). In step 68, if a continuous number of channel factors F are found to be greater than the upper control limit (for example, 14), and the continuous number is greater than a pre-determined maximum continuous fault count (MCFC, for example, 6), it may be determined that the beam current has drifted lower. The implantation process should thus be paused (step 72), and the implantation system needs to be verified. Also, alerts may be sent (74). Conversely, in step 68, if a continuous number of channel factors F are found to be lower than the lower control limit (0.99), and the continuous number is greater than the MCFC (for example, 6), it is determined that the beam current has drifted higher, and the process should be paused (step 72). If the continuous fault counts are less than the MCFC, the implantation process will not be paused immediately. However, each fault will still be counted and added to a total count of faults, and if the total count of faults exceeds a pre-determined maximum total fault (MTF), for example, 30, the implantation process is also paused (step 70).

Furthermore, the real-time monitoring system (30 in FIG. 2) may monitor the operation of itself in each scan process. If it is found that the real-time monitoring system has malfunctioned, or is offline, an alert will be sent.

It is realized that the values of the upper control limit, lower control limit, MCFC and MTF are merely examples. These values may need to be changed if different implantation recipes and/or energies are used. Designers should be able to optimize these values through statistic results from experiment results, and from the manufacturing history.

Steps 64 through 74 are preferably performed by computing unit 40 as shown in FIG. 3. The statistical data are recorded in real-time monitor 42 for future optimization of the beam current monitoring.

Figure 7:
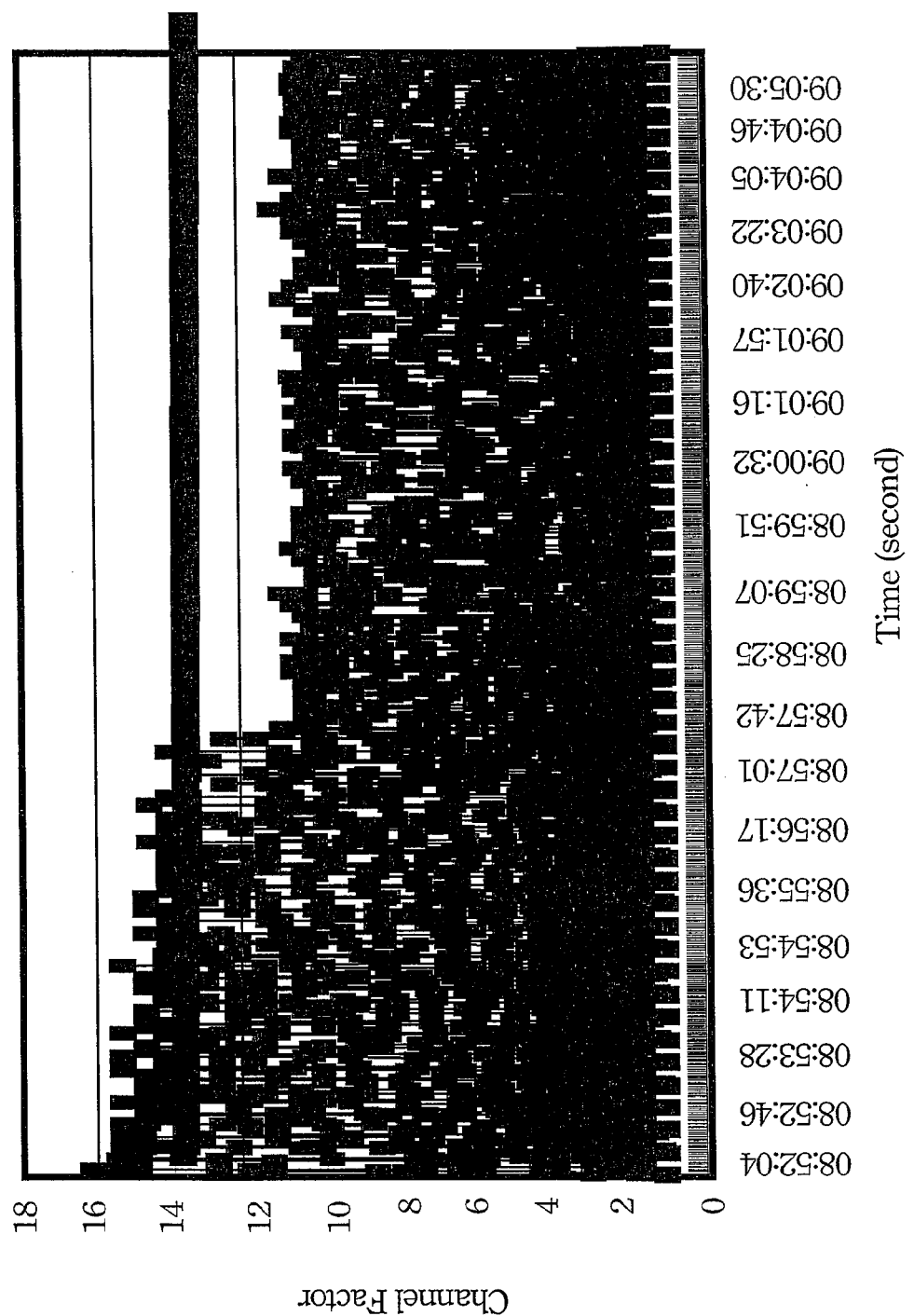
FIG. 7 illustrates channel factors calculated from real-time measured beam currents as a function of time.

FIG. 7 illustrates an experiment result, wherein the channel factors F are shown as a function of time. In this result, it is found that channel factors obtained before the time point of about 8:57 are continuously greater than 14, which indicates that during this period of time, the beam current has drifted lower than the desirable value. The implanter thus should be paused, and the wafers receiving the implantation may need to be scraped.

The embodiments of the present invention may further be modified. For example, statistic results have shown that the first several scan processes, particularly first three scan processes, tend to have significantly higher peak channel factors F than average peak channel factors. Therefore, the upper control limit for the first several scan processes may be set higher, for example, higher than 14, while the remaining scan processes may have lower upper control limit. Therefore, these normal, although undesirable, behaviors will not cause the expected pause of the implanter.

One skilled in the art will realize that the definition of channel factors merely reflects whether the real-time sensed beam currents have deviated from the initial beam current and from the statistic data. Therefore, the real-time sensed beam current may be processed differently to determine the beam current status of the implanter. In the previously discussed embodiment, the beam current drift is most likely to be caught at the starting time of the scan processes, and at where the centers of the wafers are aligned to the beam. This embodiment may be further improved, so that the beam current drift can be equally caught at any scan position. The improved embodiment is briefly discussed as follows.

It is realized that for different scan positions x, the beam shadow factors A(x) (refer to Equation 3) are different. Therefore, for each scan position x, there is an expected channel factor range. From scan position to scan position, the expected channel factor ranges are very likely to be different. For example, at the scan position shown in FIG. 4A, the channel factor may be between 0.9 and 1.1, while at the scan position shown in FIG. 4B, the channel factor may be between 8 and 14, and at the scan position shown in FIG. 4C, the channel factor may be between about 2 and 6. For each scan position x, the expected channel factor range may be determined from the statistic channel factors F found in historic implantations. If at any scan position x, the corresponding channel factor F exceeds the expected range for this scan position, it is deemed as a fault. Correspondingly, if a continuous fault count is found to be greater than MCFC, wherein the faults are either all above the expected range, or all lower than the expected range, the implanter is paused. Similarly, if the total fault count is greater than MTF, the implanter is also paused.

Advantageously, the embodiments of the present invention make the real-time monitor of implanters possible. Accordingly, the drifts of beam current can be found in real time. Particularly, the drifts occurred not at the starting and the ending points can be found, and the corresponding wafers may be scraped at early stages. This can also avoid the waste of more wafers.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus for monitoring beam currents of an implanter, the apparatus comprising:
    a beam-sensing unit for sensing the beam currents, the beam-sensing unit being positioned on an opposing side of a wafer position from a beam source;
    a position-determining unit for determining scan positions; and
    a computing unit for, during an implanting process:
        receiving the beam currents from the beam-sensing unit;
        receiving the scan positions from the position-determining unit; and
        determining a drift status of the implanter from the beam currents, wherein the computing unit is configured to receive the beam currents and the scan positions periodically between a starting time and an ending time of a scan process of the implanter; and wherein the determining of the drift status is performed while implanting the wafer.

2. The apparatus of claim 1 further comprising a real-time monitor for storing statistic data of historic beam currents and historic scan positions obtained from historic wafer implantation processes, wherein the step of determining the drift status from the beam current comprises comparing the beam currents with the statistic data.

3. The apparatus of claim 1, wherein the computing unit is configured to construe a correlation between scan positions and historic beam current ranges, and comparing a beam current at a scan position to a respective one of the historic beam current ranges.

4. The apparatus of claim 1, wherein signals outputted by the beam-sensing unit and the position-determining unit are analog signals, and wherein the apparatus further comprises analog-to-digital converters to convert the analog signals to digital signals, and wherein the analog-to-digital converters are further coupled to the computing unit.

5. The apparatus of claim 4 further comprising a buffer server between the analog-to-digital converters and the computing unit, wherein the buffer server is configured to store the digital signals and transmitting the digital signals to the computing unit.

6. The apparatus of claim 1, wherein the computing unit is configured to send a signal to pause the implanter when a drift of the implanter is found.

7. The apparatus of claim 6, wherein the computing unit is connected to a digital-to-analog converter through a buffer server, and wherein the digital-to-analog converter is further connected to a control center of the implanter.

8. An implanter for implanting wafers, the implanter comprising:
    a movable spin wheel configured to have wafers mounted thereon;
    a beam-sensing unit to:
        sense a first beam current at a starting time of a scan process; and
        sense a second beam current at an intermediate time between the starting time and an ending time of the scan process, the sensing the second beam current being performed while implanting a wafer; and
    a computing unit to:
        receive the first and the second beam currents from the beam-sensing unit;
        calculate a channel factor using the first and the second beam currents; and
        determine a drift status of the implanter by comparing the channel factor and a pre-determined channel factor range, the determining the drift status being performed while implanting the wafer.

9. The implanter of claim 8 further comprising:
    a position-determining unit for determining a scan position of the movable spin wheel at the intermediate time, wherein the computing unit is configured to receive the scan position.

10. The implanter of claim 9, wherein the position-determining unit is configured to determine a plurality of scan positions of the movable spin wheel periodically between the starting time and the ending time of the scan process, and wherein the beam-sensing unit is configured to determine a plurality of beam currents, each corresponding to one of the plurality of scan positions.

11. The implanter of claim 10, wherein the computing unit is configured to perform the steps of:
    for each of the plurality of the scan positions:
        determining a beam current corresponding to the each of the plurality of the scan positions;
        calculating a real-time channel factor from the beam current;
        retrieving a pre-determined allowable channel factor range corresponding to the each of the plurality of the scan positions; and
        comparing the real-time channel factor with the pre-determined allowable channel factor to determine the drift status of the implanter.

12. The implanter of claim 11, wherein the channel factor is proportional to a ratio of the first beam current to the beam current.

13. The implanter of claim 9, wherein the beam-sensing unit comprises a first encoder connected to a beam current sensor, and wherein the position-determining unit comprises a second encoder connected to the implanter, and wherein the implanter further comprises:
    a converter connected to the first and the second encoders; and a buffer server connected to the converter and the computing unit.

14. A method of monitoring a scan process of an implanter, the method comprising:
pre-determining a first allowable beam current range;
measuring a first beam current at a starting time of the scan process;
moving a wafer in a first direction and a second direction;
measuring, after the moving, a second beam current at an intermediate time between the starting time and an ending time of the scan process; and
determining a drift status of the implanter by comparing the second beam current to the first beam current and the first allowable beam current range, the determining being completed while implanting the wafer during the scan process.

15. The method of claim 14, wherein the step of pre-determining the allowable beam current range comprises collecting statistic data from wafer implantation processes, and determining a maximum beam current and a minimum beam current from the statistic data.

16. The method of claim 14 further comprising:
determining a scan position at the intermediate time;
pre-determining a second allowable beam current range corresponding to the scan position;
measuring a third beam current at an additional intermediate time between the starting time and the ending time of the scan process;
determining an additional scan position at the additional intermediate time;
pre-determining a third allowable beam current range corresponding to the additional scan position, wherein the second and the third allowable beam current ranges are different; and
determining the drift status of the scan process by comparing the second beam current to the second allowable beam current range, and the third beam current to the third allowable beam current range.

17. The method of claim 14, wherein the step of determining the drift status comprises:
calculating a channel factor from the first and the second beam currents; and
pre-determining an allowable channel factor range, wherein the allowable channel factor range corresponds to the first allowable beam current range; and
comparing the channel factor with the allowable channel factor range.

18. The method of claim 17, wherein the channel factor equals to a ratio of the first beam current to the second beam current.

19. A method of monitoring an implanter, the method comprising:
pre-determining an allowable channel factor range, wherein the allowable channel factor range comprises a maximum channel factor and a minimum channel factor;
starting a scan process for a wafer;
measuring a first beam current at a starting time of the scan process;
periodically measuring a plurality of second beam currents in a duration between the starting time and an ending time of the scan process, the periodically measuring being performed while implanting ions in the wafer;
calculating a plurality of channel factors, each by using the first beam current and one of the plurality of second beam currents; and
determining a drift status of the implanter by comparing the plurality of channel factors with the allowable channel factor range, the determining being performed while implanting the wafer during the scan process.

20. The method of claim 19, wherein the step of periodically measuring the plurality of second beam currents are performed at an interval of between about 0.1 seconds and about 0.2 seconds.

21. The method of claim 19, wherein the plurality of second beam currents has a count of greater than about 70.

22. The method of claim 19, wherein the step of determining the drift status of the implanter comprises increasing a fault count each time one of the plurality of the channel factors exceeds the allowable channel factor range.

23. The method of claim 22, further comprising pausing the implanter if a continuous fault count is greater than a pre-determined maximum continuous fault count.

24. The method of claim 23, wherein all channel factors corresponding to the continuous fault count are greater than the maximum channel factor.

25. The method of claim 23, wherein all channel factors corresponding to the continuous fault count are less than the minimum channel factor.

26. The method of claim 22 further comprising pausing the implanter if a total fault count is greater than a pre-determined maximum total fault count.

27. The method of claim 19 further comprising performing a plurality of scan processes comprising a first and a second scan process, wherein a first allowable channel factor range of the first scan process is different from a second allowable channel factor range of the second scan process.

28. The method of claim 27, wherein the first scan process is performed before the second scan process, and wherein the first scan process has a greater range than the second scan process.

* * * * *